US007656204B2

(12) United States Patent
Henzler et al.

(10) Patent No.: US 7,656,204 B2
(45) Date of Patent: Feb. 2, 2010

(54) DIVIDER CIRCUIT

(75) Inventors: Stephan Henzler, Taufkirchen (DE); Siegmar Koeppe, Munich (DE)

(73) Assignee: Infineon Technologies AG, Munich (DE)

(*) Notice: Subject to any disclaimer, the term of this patent is extended or adjusted under 35 U.S.C. 154(b) by 68 days.

(21) Appl. No.: 11/713,544

(22) Filed: Mar. 2, 2007

(65) Prior Publication Data

US 2007/0216451 A1    Sep. 20, 2007

(30) Foreign Application Priority Data

Mar. 2, 2006    (DE) .................. 10 2006 010 282

(51) Int. Cl.
    *H03K 21/00*    (2006.01)
    *H03K 23/00*    (2006.01)
    *H03K 25/00*    (2006.01)
(52) U.S. Cl. ...................... 327/115; 327/218
(58) Field of Classification Search ............ 327/218; 326/95–98
    See application file for complete search history.

(56) References Cited

U.S. PATENT DOCUMENTS

| 6,690,209 | B1* | 2/2004 | Cyrusian ............... 327/12 |
| 7,285,985 | B2* | 10/2007 | Sasagawa et al. ......... 326/93 |
| 7,304,576 | B2* | 12/2007 | Findlay et al. .......... 340/572.1 |
| 2004/0008068 | A1* | 1/2004 | Kim ..................... 327/218 |

FOREIGN PATENT DOCUMENTS

EP    1 133 058 A2    9/2001

OTHER PUBLICATIONS

Yang, Lixin, et al. "A Non-Feedback Multiphase Clock Gnerator Using Direct Interpolation." The IEEE 2002 45th Midwest Symposium on Circuits and Systems. Tulsa, Oklahoma. IEEE, Aug. 4-7, 2002. p. 4-7. (4 Pages).*
Yang, Lixin, et al. "A Non-Feedback Multiphase Clock Generator Using Direct Interpolation." *The IEEE 2002 45th Midwest Symposium on Circuits and Systems*. Tulsa, Oklahoma. IEEE, Aug. 4-7, 2002. p. 4-7. (4 Pages).
Nikolié, Borivoje, et al. "Improved Sense-Amplifier-Based Flip-Flop: Design and Measurements." *IEEE Journal of Solid-State Circuits*. vol. 35, No. 6. IEEE, Jun. 2000. p. 876-884. (10 Pages).
Kim, Jin-Cheon, et al. "A Sense Amplifier-Based CMOS Flip-Flop with an Enhanced Output Transition Time for High-Performance Microprocessors." *6th International Conference on VLSI and CAD, ICVC '99*. Seoul, South Korea. IEEE Oct. 26-27, 1999, p. 384-387. (4 Pages).

* cited by examiner

*Primary Examiner*—Lincoln Donovan
*Assistant Examiner*—Daniel Rojas
(74) *Attorney, Agent, or Firm*—Maginot, Moore & Beck (57) ABSTRACT

A divider circuit comprises at least two clock edge controlled differential buffer store elements, each being clocked by complementary input clock signals, each comprising internal storage nodes which are pre-chargeable to a pre-charge potential, and each comprising a differential data input. The internal storage nodes of the buffer store elements are either pre-charged at the pre-charge potential or store a logic level, depending on the relevant input clock signals. The differential data inputs of one of the buffer store elements is connected to the internal storage nodes of the other buffer store element and pulsed signals can be tapped off at the internal differential storage node.

14 Claims, 8 Drawing Sheets

DIVIDER CIRCUIT

BACKGROUND OF THE INVENTION

The present invention relates to a divider circuit.

Signal processing frequently requires output clock signals which are derived from high frequency signals, for example input clock signals, and whose frequency is divided in comparison with the input clock and which have a prescribed phase relationship among one another. What are known as IQ signals, which are required in reception circuits for mobile radio applications, for example, have two real signal components which are 90° out of phase with one another, the I component (Inphase) preceding the Q component (Quadrature) by 90° for positive frequencies and following it by 90° for negative frequencies.

Corresponding frequency divider circuits usually use flip-flops, where a signal is fed back from a data output to a data input, which, in the case of D-type flip-flops, for example, changes the output state upon every positive clock edge. At particularly high input clock frequencies, e.g. in the Gigahertz range, the DQ delay time, that is to say the delay between the application of an input signal level D and the presence of the corresponding signal level at an output Q of the respective flip-flop used, has a disadvantageous effect on the operation of the divider circuit. In this context, the maximum possible input frequency is limited at the top by the DQ delay time of the flip-flops used and any logic circuits which are required.

The delay time of flip-flops designed using conventional CMOS circuitry may be longer than the length of half an input clock cycle. In the past, high input frequencies have therefore prompted a change to embodiments using CML (Current Mode Logic), which has higher associated power losses as a result of constantly flowing currents, however. Particularly mobile radio applications require circuits with very low power consumption and hence very little power loss, however. The majority of complex circuit arrangements in the mobile radio sector are therefore designed using static CMOS technology. If CML circuit parts are then used for fast divider circuits, it is additionally necessary to perform level conversion for CMOS signals. This is associated with additional circuit complexity and further power loss.

To increase the speed of flip-flops designed using CMOS technology, the article "Improved Sense-Amplifier-Based Flip-Flop: Design and Measurements" B. Nikolic et al. in IEEE Journal of solid-state circuits, volume 35, No. 6, June 2000, for example, proposed sense-amplifier-based flip-flops (SAFFs). The article describes an SAFF comprising a differential sense amplifier as master latch and an RS-type flip-flop as slave latch, the sense amplifier stage producing a change from logic High to logic Low level at one of its outputs upon every rising clock edge. The corresponding SAFF is particularly suitable for use in pipeline stages in microprocessors at clock rates of up to 1 GHz.

In the case of frequency divider circuits in receiver or transmitter circuits, for example for mobile radio, ADSL, serial ATA or other wired transmissions, even higher frequencies of a few Gigahertz need to be processed, however. In addition, a duty cycle of 0.5 needs to be provided, as far as possible, for the output clock signal produced at a divided frequency. In this case, it is also beneficial to output a plurality of signals with a prescribed phase shift among one another. By way of example, these may be used as sample control signals in sample/hold circuits or analog-digital converters. Other use options are IQ transmission and reception circuits, which require orthogonal signals.

Embodiments using conventional CMOS logic are also possible, since in that case particularly no static current sources are required, in contrast to Current Mode Logic implementations.

BRIEF SUMMARY OF THE INVENTION

In one aspect of the invention, a divider circuit comprises at least two clock edge controlled differential buffer store elements which are clocked by complementary input clock signals. The buffer store elements comprise, internally, storage nodes which can be pre-charged to a pre-charge potential and a respective differential data input. In this context, the internal storage nodes of a buffer store element are either at the pre-charge potential or store a logic level, depending on the respective input clock signal. In addition, a respective differential data input of a buffer store element is connected to the internal storage nodes of the other buffer store element. Pulsed signals can be tapped off at the internal differential storage nodes.

Potentials or signals may be tapped off at internal pre-chargeable storage nodes of the buffer store elements and may be used as input signals for the respective other buffer store element. At the differential storage nodes, that is to say four nodes in total, it is then possible to tap off pulsed signals which are in a fixed phase relationship with one another. Based on the input clock frequency, a halved output clock frequency is obtained from the time interval between directly successive rising pulse edges in a respective individual pulsed signal. The pulse duration and the pulse level in these pulsed signals may in this case be dependent on the frequency of the input clock signal, on the specific implementation, on the respective components of the buffer store elements and on the operation conditions, such as the temperature or the supply voltage.

BRIEF DESCRIPTION OF THE SEVERAL VIEWS OF THE DRAWINGS

The invention will be described in greater detail hereinafter, by way of non-limiting examples, with reference to the embodiments shown in the drawings.

DETAILED DESCRIPTION OF THE INVENTION

In one embodiment, the divider circuit may comprise at least one first and a second differential buffer store element which is clocked by a respective input clock signal and which comprises a first and a second internal storage node and a first and a second data input, respectively. In a first input clock signal phase, the first and second internal storage nodes of the first buffer store element may be pre-charged to a pre-charge potential, and the first and second internal storage nodes of the second buffer store element respectively may store a logic level applied to the first or second data input of the second buffer store element. In a second input clock signal phase, the first and second internal storage nodes of the second buffer store element may then be pre-charged to a pre-charge potential, and the first and second internal storage nodes of the first buffer store element respectively may store a logic level applied to the first and second data inputs of the first buffer store element. The first data input of the first buffer store element may be connected to the first internal storage node of the second buffer store element. The second data input of the first buffer store element may be connected to the second internal storage node of the second buffer store element. The first data input of the second buffer store element may be connected to the second internal storage node of the first buffer store element, and the second data input of the second buffer store element may be connected to the first internal storage node of the first buffer store element.

The buffer store elements may be in the form of sense amplifiers. The corresponding sense amplifier operates particularly quickly on account of the storage nodes which may be pre-charged during an input half clock cycle, and allows the output of reliable pulsed signals in a fixed phase relationship with one another at high input clock frequencies. Their internal feedback means that sense amplifiers also have the property that a switching operation is completed even if the respective input signal changes again directly after the clock edge.

At least one buffer store element may comprise at least one data output. In this case, a buffer device may be coupled between an internal storage node and the data output, and a buffered pulsed signal may be tapped off at the data output. The buffer device, for example a CMOS inverter, may decouple the output load capacitance of the inventive divider stage from the internal storage nodes and may improve the signal quality of the pulsed signals. The buffer device used may be inverters, buffers or other logic devices which are known per se, for example.

The buffer store elements or the full divider circuit may be designed entirely using conventional static CMOS technology. In this case, no static current sources are provided, in particular. Even at high input clock frequencies, high threshold voltages or a low supply voltage, the interconnection of the sense amplifiers allows the use of a CMOS circuit topology without static current sources, such as CML. The tap at the internal pre-chargeable storage nodes allows minimization of the latency which arises as a result of the interconnection of the storage elements and hence support for the inherent inertia of the CMOS components.

A rising or falling input clock signal edge may prompt a logic level of the signal applied to the respective data input to be transferred to the respective internal storage node.

In one embodiment of the inventive divider circuit, at least one pulldown device may be provided which takes at least one pulsed signal or a buffered pulsed signal as a basis for discharging a dynamic storage node pre-charged to a pre-charge potential and outputs a conditioned pulsed signal. A conditioned pulse signal is to be understood to mean a buffered pulsed signal defined in terms of its logic level and its pulse length over time.

The pulsed signals which are first of all tapped off at the internal storage nodes may control discharge switches which may be provided in the pulldown device, for example, so that the pulldown device produces a signal edge from the pre-charge potential, for example to logic L level.

The pulldown device may also comprise at least one controllable pre-charge switch which takes at least one conditioned pulsed signal as a basis for connecting the dynamic storage node to the pre-charge potential. This again may impress a signal change from logic L level to logic H level or the pre-charge potential on the dynamic storage node. In principle, it is thus also possible to use the pulsed signals applied to the internal storage node or the buffered pulsed signals directly for actuating the pre-charge switches.

In one embodiment of the inventive circuit, the pulldown device may also take at least one control signal as a basis for connecting the dynamic storage node to the pre-charger potential and/or to a predetermined logic level. By way of example, the control signals may be logically combined with the conditioned pulsed signals and/or with the pulsed signals and may in this way actuate the controllable discharge switches or pre-charge switches.

In one embodiment of the inventive divider circuit, four pulldown devices may be provided, with a respective controllable discharge switch being controlled by a pulsed signal, and a respective pre-charge switch being controlled by a conditioned pulsed signal which is phase shifted through 90° relative to the conditioned pulsed signal. This 90° phase relates to an output clock period which is defined by two directly successive, rising or falling pulse edges in one of the pulsed signals or the buffered pulsed signals.

This may result in conditioned pulsed signals such that a conditioned pulsed signal which can be tapped off at a respective dynamic storage node is phase shifted by +90° relative to a first conditioned pulsed signal, which directly precedes the conditioned pulsed signal, and by −90° relative to a second conditioned pulsed signal, which directly follows the conditioned pulsed signal, and comprises a period duration which corresponds to twice the period of the input clock signal.

In one embodiment of the inventive divider circuit, at least two RS-type flip-flops comprising a Set input, a Reset input, a flip-flop data output and an inverse flip-flop data output may be provided. In this arrangement, the Set inputs and the Reset inputs may be respectively supplied with two conditioned pulsed signals. The series connection of the two RS-type flip-flops allows the output of a frequency-divided output clock signal or respective conditioned pulsed signals which have a duty ratio of exactly 0.5 or 50%.

In the figures, unless otherwise stated, elements, features and signals which are the same and have the same function have been provided with the same reference symbols.

Figure 1:
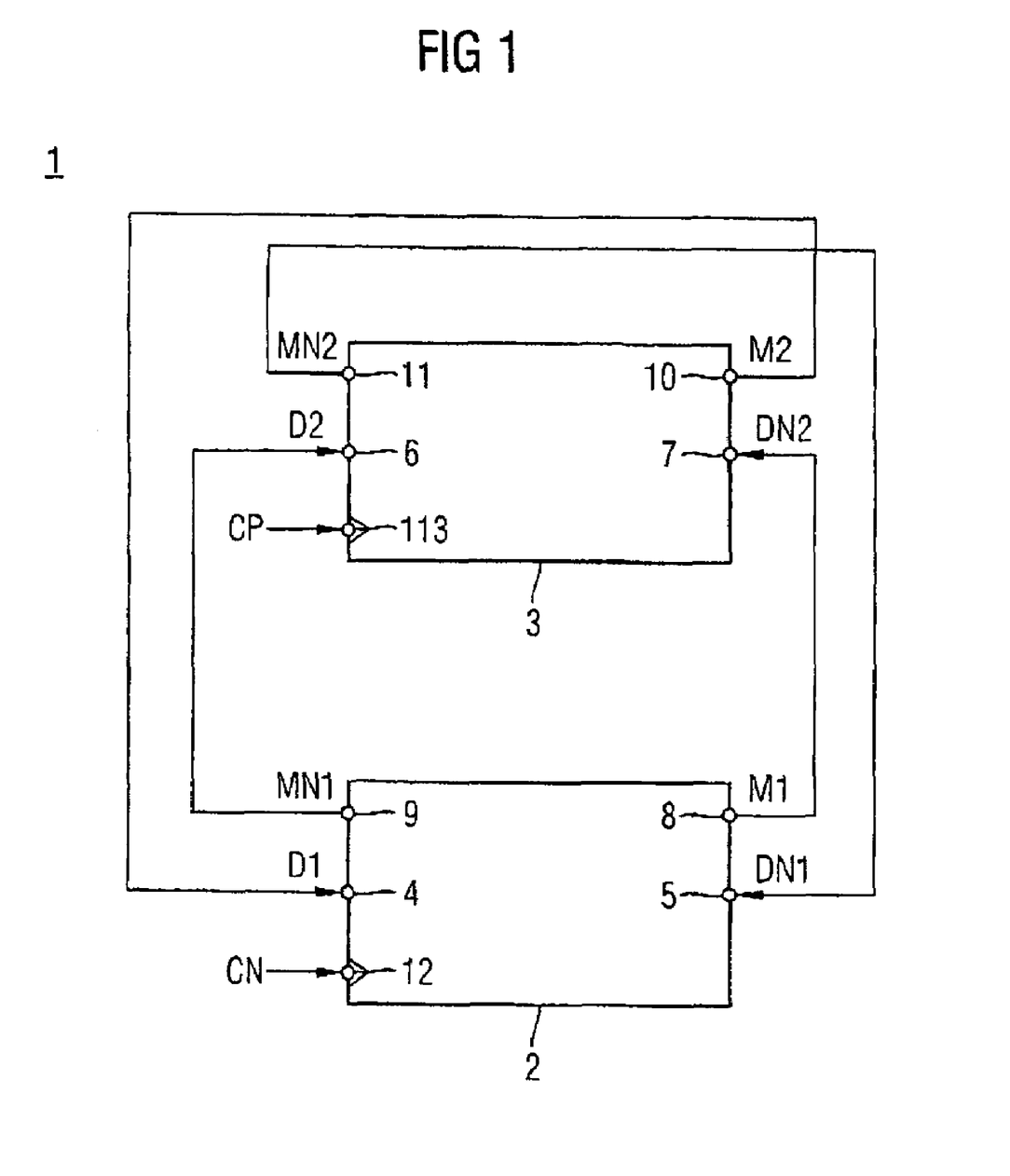
FIG. 1 is a block diagram of divider circuit.

FIG. 1 shows a block diagram of divider circuit 1.

FIG. 1 shows a first buffer store element 2 and a second buffer store element 3. The buffer store elements 2, 3 comprise respective differential data inputs 4, 5, 6, 7 with a first data input 4, 6 and a second data input 5, 7, respectively. Each buffer store element 2, 3 comprises a differential storage node 8, 9, 10, 11 comprising a first internal storage node 8, 10 and a second internal storage node 9, 11, respectively. The internal storage nodes 8, 9, 10, 11 can be pre-charged to a pre-charge potential within the buffer store elements 2, 3. The buffer store elements 2, 3 comprise clock inputs 12, 113 and are clocked with mutually complementary input clock signals CN, CP.

The signal M1 which can be tapped off at the first internal storage node 8 of the first buffer store element 2 is supplied to the second data input 7 of the second buffer store element 3 as an input data signal DN2. The signal MN1 which can be tapped off at the second internal storage node 9 of the first buffer store element 2 is supplied as an input data signal D2 to the first data input 6 of the second buffer store element 3. The signal M2 which can be tapped off at the first internal storage node 10 of the second buffer store element 3 is supplied to the first data input 4 of the first buffer store element 2 as an input data signal D1, and the signal MN2 which can be tapped off at the second internal storage node of the second buffer store element 3 is supplied to the second data input 5 of the first buffer store element 2 as an input data signal DN1.

Figure 3:
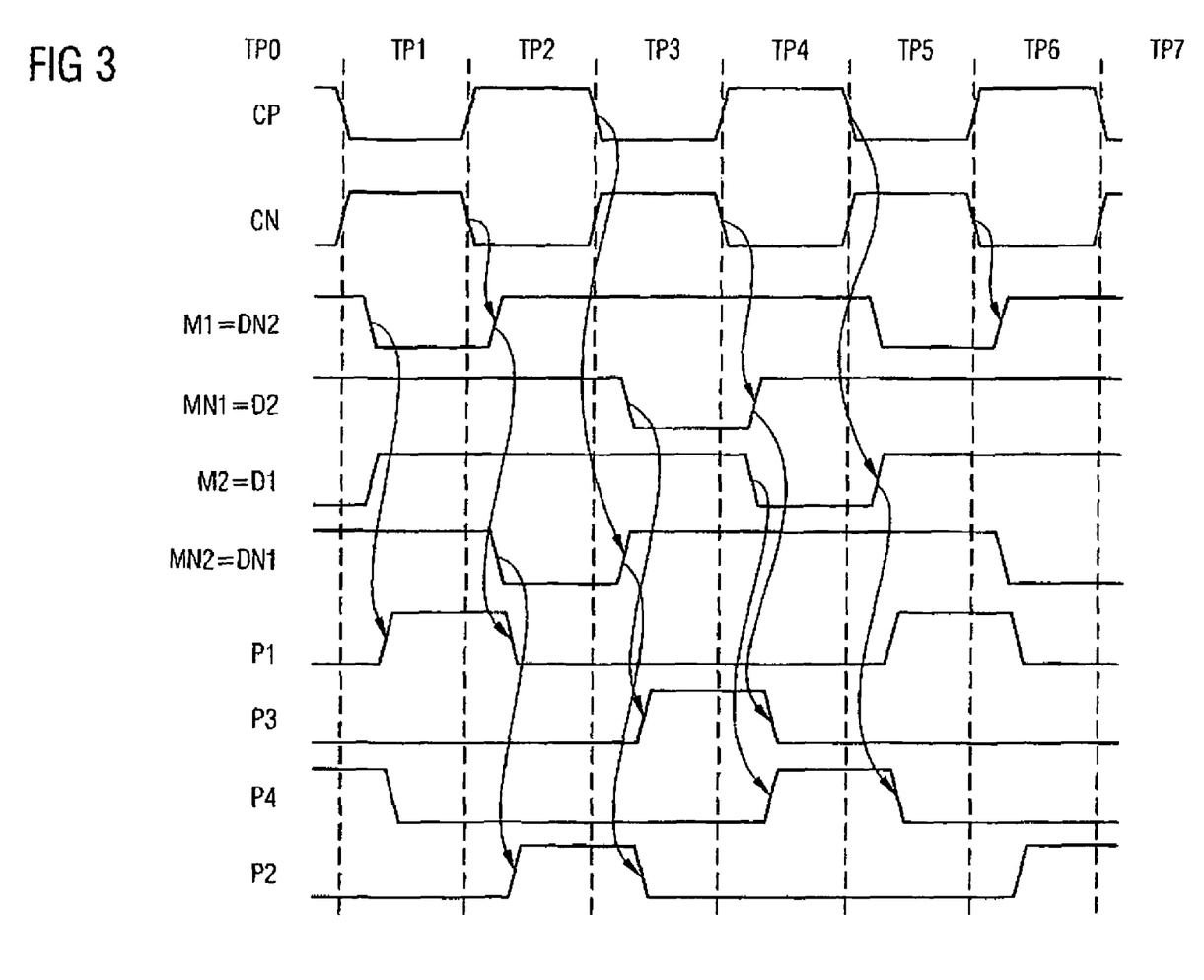
FIG. 3 are signal timing diagrams for the signals arising in the divider circuit in FIGS. 1 and 2.

The interconnection of the two buffer store elements 2, 3 and particularly the use of the internal signals or levels M1, MN1, M2, MN2 gives a signal profile which is shown in FIG. 3, for example. In this case, the first two rows of FIG. 3 show the complementary input clock signals CP, CN over the course of, in this case, by way of example, eight chosen input clock signal phases TP0-TP7. The fact that in the respective input clock signal phases TP0-TP7 either the internal storage nodes 8, 9, 10, 11 are pre-charged to the pre-charge potential, for example logic H level, and in the second input clock signal phase, which follows it in time, store the signal levels applied to the respective data inputs means that the internal storage nodes 8, 9, 10, 11 or the data inputs 4, 5, 6, 7 connected thereto produce pulsed signals, which are denoted by M1, MN1, M2 and MN2 in FIG. 3. As described below, these are used to actuate pulldown devices. Alternatively, it is also conceivable to use a pullup device in PMOS architecture, with a node which can be pre-charged to the second supply voltage potential VSS being discharged by a PMOS transistor as switching means.

Figure 2:
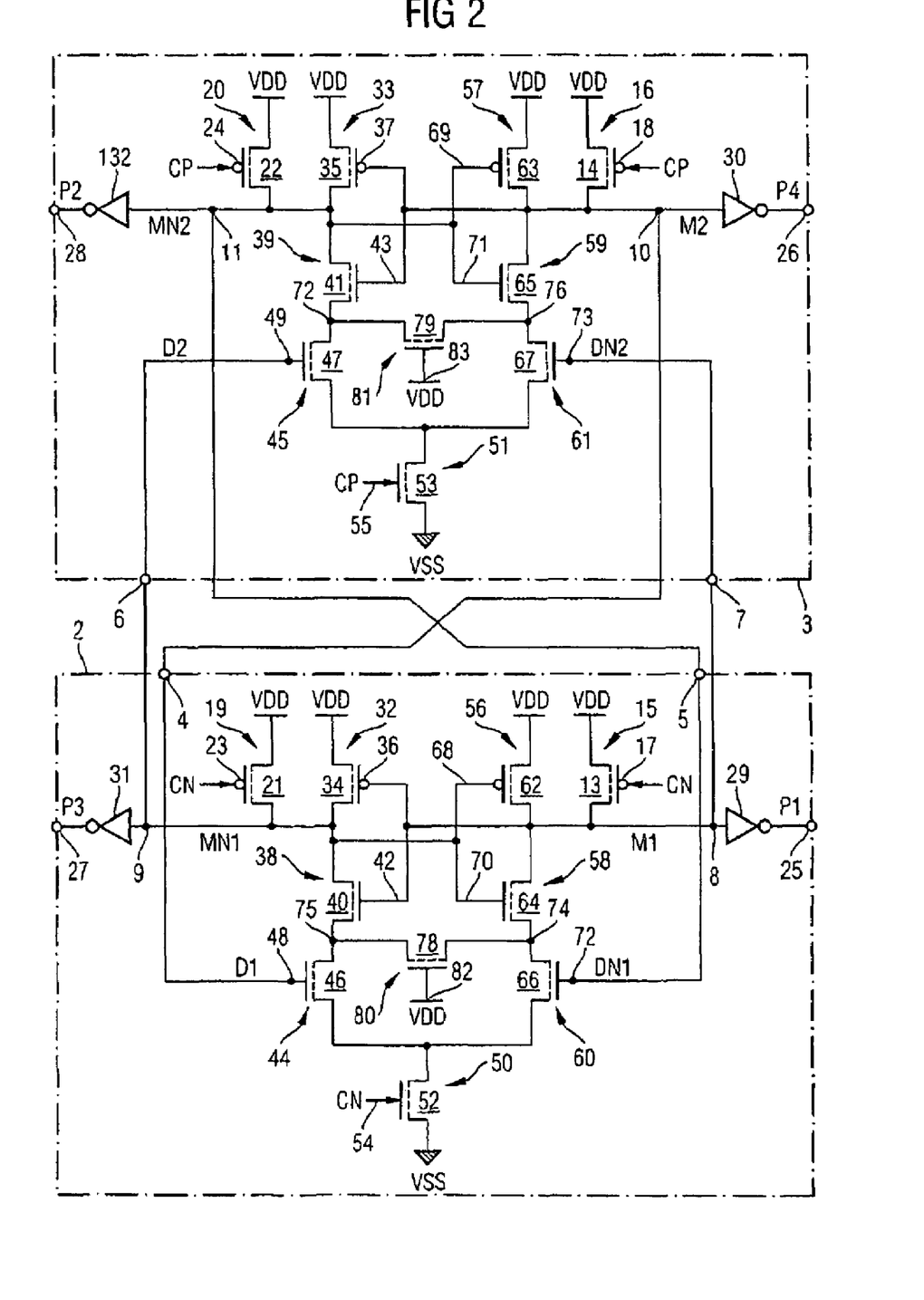
FIG. 2 is a circuit diagram of a divider circuit.

FIG. 2 shows a circuit diagram of an exemplary embodiment of the two buffer store elements connected up for the divider circuit 1. The buffer store elements 2, 3 may be in the form of sense amplifiers. In FIG. 2, the same reference symbols as in FIG. 1 have been used for the data inputs 4, 5, 6, 7 and the internal pre-chargeable storage nodes 8, 9, 10, 11.

For the exemplary embodiment, the first sense amplifier (SA) 2 is clocked by a first input clock signal CN, and the second SA 3 is clocked by a clock signal CP which is complementary thereto. The text below describes the design of the SAs by way of example using one of the SAs.

For the exemplary embodiment, a first pullup transistor 15, 16 comprising a controllable path 13, 14 and a control connection 17, 18 is provided whose controllable path 13, 14 is connected between the first internal storage node 8, 10 and a first supply voltage potential VDD. A second pullup transistor 19, 20 having a controllable path 21, 22 and a control connection 23, 24 is provided, with its controllable path 21, 22 being connected between the second internal storage node 9, 11 and the first supply voltage potential VDD.

The buffer store elements 2, 3 or sense amplifiers each comprise a first data output 25, 26 and a second data output 27, 28. Provided between the first internal storage node 8, 10 and the respective first data output 25, 26 is a respective inverter 29, 30. Provided between the second internal storage node 9, 11 and the respective second data output 27, 28 is a respective further inverter 31, 132. The inverters 29-31, 132 are used as buffer devices.

For the exemplary embodiment, there are also a PMOS transistor 32, 33 and three NMOS transistors 38, 39, 44, 45, 50, 51 comprising a controllable path 34, 35, 40, 41, 46, 47, 52, 53 and a control connection 36, 37, 42, 43, 48, 49, 54, 55, respectively. The controllable paths 34, 40, 46, 52 and 35, 41, 47, 53 are connected in series between the first supply voltage potential VDD and a second supply voltage potential VSS. The controllable paths 34, 40 and 35, 41 have the second internal storage node 9, 11 arranged between them. The control connections 36, 42 and 37, 43 are connected to one another and are coupled to the first internal storage node 8, 10. The control connection 48, 49 is connected to the first data input 4, 6. The control connection 54, 55 has the input clock signal CN, CP routed to it.

For the exemplary embodiment, there are also a PMOS transistor 56, 57 and two NMOS transistors 58, 59, 60, 61 comprising a controllable path 62, 63, 64, 65, 66, 67 and a control connection 68, 69, 70, 71, 72, 73, respectively. The controllable paths 62, 64, 66 and 63, 65, 67 can be connected between the first supply voltage potential VDD and the second supply voltage potential VSS by means of the NMOS transistor 50, 51.

The control connections 68, 70 and 69, 71 may be connected to one another and are coupled to the respective second internal storage node 9, 11. The control connection 72, 73 is coupled to the second data input 5, 7.

Connected between line nodes 74, 75, 76, 77, which are situated between the controllable paths 64 and 66, 40 and 46, 65 and 67 or 41 and 47, there is the respective controllable path 78, 79 of an NMOS transistor 80, 81, the latter's control connection 82, 83 being connected to the first supply voltage potential VDD.

For an input clock signal CN=1 which is at logic H level and a complementary input clock signal CP=0 which is at logic L level, the PMOS transistors 15, 19 in the first buffer store element 2 are off. In this case, the first supply voltage potential VDD is used as pre-charge potential beforehand. At the same time, the transistor 50 is on. The input transistors 44, 60 are used to discharge the pre-charged storage nodes 8, 9. The complementary nature of D1 and D1N means that one of the storage nodes will discharge significantly more quickly than the other. The latch formed assists this operation and holds the state, even if the input signals change again after the rising clock edge. Between the two internal storage nodes 8, 9, a latch comprising negative feedback inverters is thus produced by means of the transistors 32, 38, 56, 58. The levels which are present at the internal storage nodes 8, 9 are stored. In the second buffer store element 3, on the other hand, the two PMOS transistors 16, 20 connect the internal storage nodes 10, 11 to the first supply voltage potential VDD as pre-charge potential. At the same time, the NMOS transistor 51 decouples the transistors 55, 61 from the second supply voltage potential VSS.

If, in a subsequent input clock signal phase, the input clock signal CN is at logic L level (CN=0) and its complementary input clock signal CP is at logic H level (CP=1) then the pullup transistors 20, 16 are off and the transistors 33, 39, 57, 59 produce a latch or negative feedback inverter. The logic levels which are present at the internal storage nodes 10, 11 are therefore stored. At the same time, the pullup transistors 15, 19 pull up the internal storage nodes 8, 9 to the first supply voltage potential VDD or a pre-charge potential. In this case, the transistor 50 is off. One buffer store element is accordingly always in a pre-charge phase while the respective other one is in a hold phase.

Operation of the divider circuit 1 shown in FIG. 2 therefore produces signal flows as shown in FIG. 3. In the first input clock signal phase TP1, it is the first buffer store element 2 in the hold phase and the second buffer store element 3 in the pre-charge phase. This brings the potentials or signals M2, MN2 at the internal storage nodes 10, 11 to logic H level. In the subsequent input clock signal phase TP2, that is to say upon arising input clock signal edge of the clock signal CP and a falling input clock signal edge of the signal CN, the potentials MN1, M1 are brought to logic H level by the pullup transistors 15, 19. In the following, third input clock signal phase TP3, the second buffer store element 3 is in turn put into its pre-charge phase, as a result of which the signal MN2 rises to logic H level. The signal MN2 and the buffered pulsed signal P2 derived therefrom are therefore one signal pulse 2. Similar pulses are obtained for the signal forms of the potentials or signals M1, MN1 and M2 or the associated buffered pulsed signals P1, P3 and P4. Any time delay, for example between the falling input clock signal edge of the clock signal CP upon the transition from the input clock signal phase TP2 to TP3 and the rising edge of the pulsed signal MN2, is caused by the inertia of the CMOS components used in the inventive divider circuit 1.

The feedback interconnection of the sense amplifiers 2, 3 used as buffer store elements therefore results in buffered pulsed signals P1, P2, P3, P4 which have twice the period duration of the input clock signals CN, CP. The pulsed signals P1, P2, P3, P4 have a phase shift of 90° among one another. These pulses are used to actuate dynamic storage nodes.

Figure 4A:
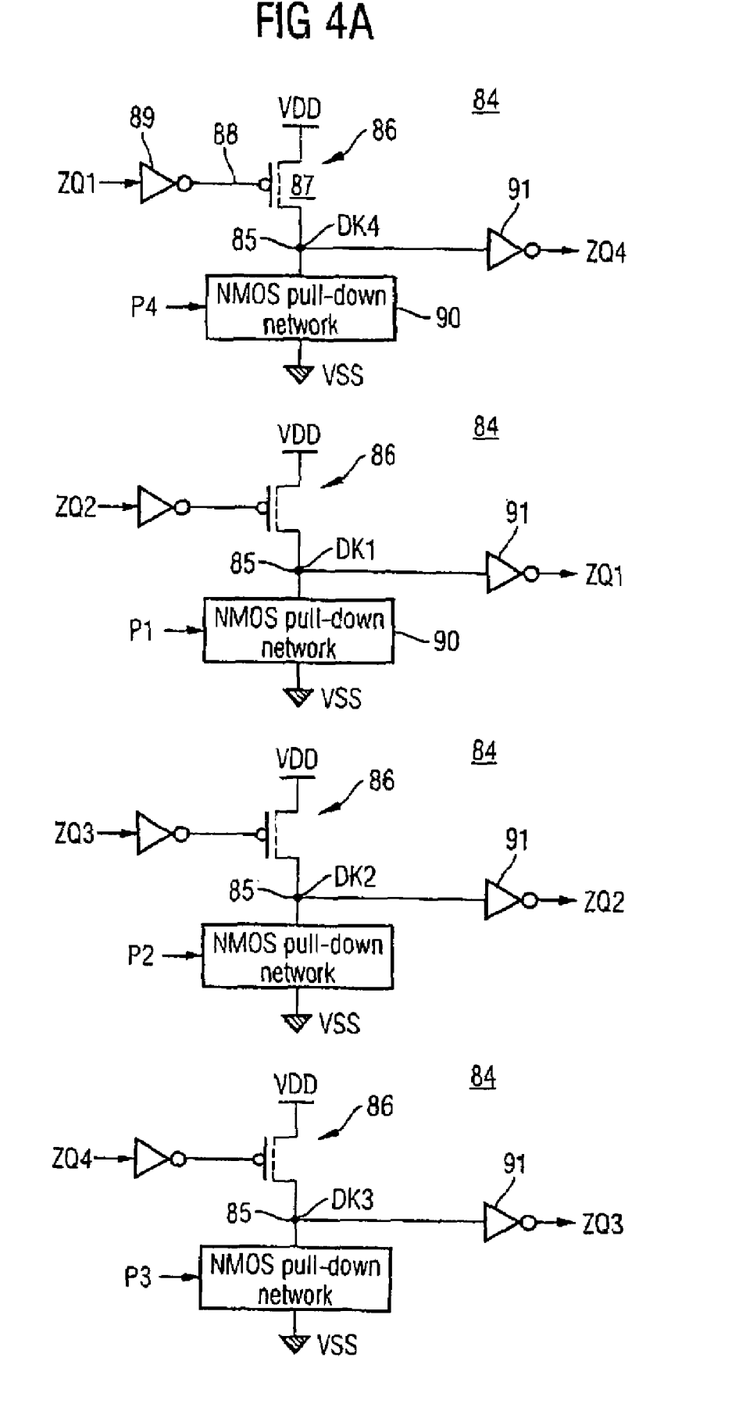
FIGS. 4A-4C are basic circuit diagrams of pulldown devices and RS-type flip-flops for the divider circuit.

FIG. 4A shows four exemplary pulldown devices 84 which are respectively associated with the buffered pulsed signals P1, P2, P3, P4. A respective dynamic storage node 85 is provided which can be connected to a pre-charge potential, corresponding to the first supply voltage potential VDD, via a pre-charge switch 86, which in this case is in the form of a PMOS transistor with a controllable path 87 and a control connection 88. The control connection 88 of the PMOS transistor is in this case controlled by a conditioned pulsed signal ZQ1, ZQ2, ZQ3, ZQ4 which is inverted by means of an inverter 89.

In addition, a discharge device 90 is provided which takes the respective associated buffered pulsed signal P4, P1, P2, P3 as a basis for discharging the dynamic storage node 85 and discharges the latter to the second supply voltage potential VSS or logic L level. The potential which is present on the dynamic storage node 85 is inverted by a further inverter 91 and is output as a conditioned pulsed signal ZQ4, ZQ1, ZQ2, ZQ3.

Quickly discharging the pre-charged storage nodes 85 via discharge switches 90, known as a "pulldown network" here, produces well-defined signal edges for the conditioned pulsed signals ZQ4, ZQ1, ZQ2, ZQ3. Since the buffered pulsed signals P1, P2, P3, P4 are respectively phase shifted through 90° and the pre-charge switches or pre-charge transistors are respectively actuated by a conditioned pulsed signal ZQ1-ZQ4 which has a phase profile shifted through 90°, the conditioned pulsed signals ZQ1-ZQ4 have a respective pulse length or pulse duration of half the period duration of the input clock signals, negligible differences being able to arise through propagation time effects.

Figure 4B:
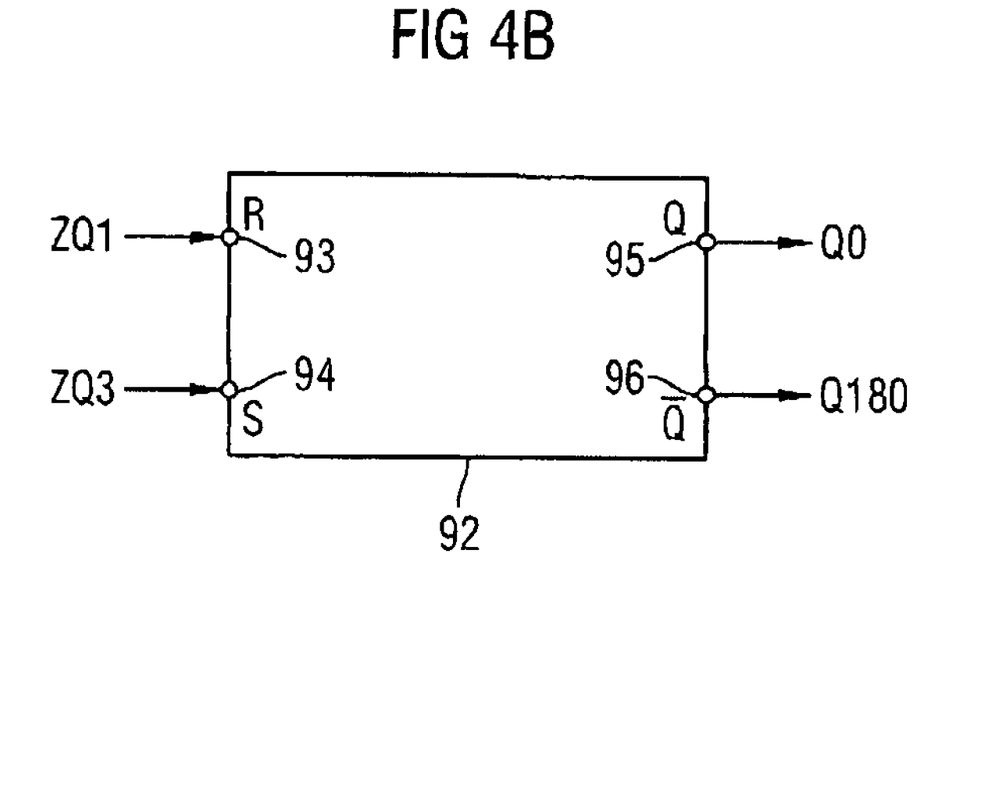
Figure 4C:
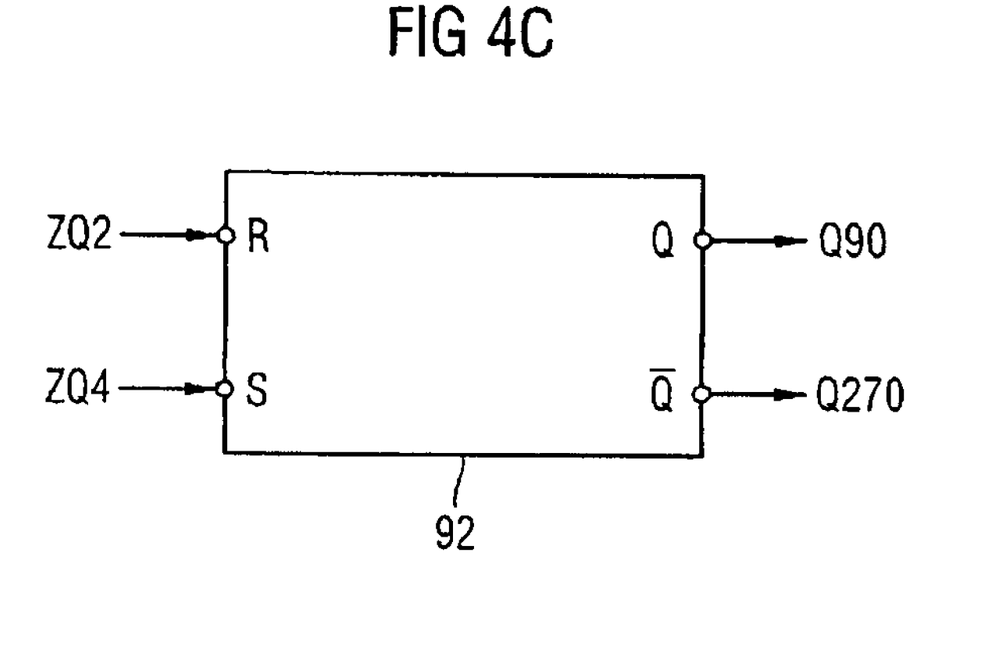

To obtain a well-defined duty ratio of, by way of example, 0.5 for the output conditioned pulsed signals ZQ1-ZQ4, preferred embodiments involve the conditioned pulsed signals ZQ1-ZQ4 being supplied to RS-type flipflops. FIGS. 4B and 4C show the corresponding actuation. They show an RS-type flipflop 92 with a Reset input 93, a Set input 94, a data output 95 and a complementary data output 96. The Reset input 93 is supplied with the first conditioned pulsed signal ZQ1, and the Set input 94 is supplied with the conditioned pulsed signal ZQ3. The two conditioned pulsed signals ZQ1 and ZQ3 are phase shifted through 180° relative to one another.

At the data outputs 95, 96 of the RS-type flipflop 92, it is then possible to tap off two output clock signals Q0, Q180 which respectively correspond to a clock signal which firstly has a duty ratio of 0.5 and secondly has twice the period duration of the input clock signal CN or CP or half the input clock frequency. Similarly, FIG. 4C shows the connections for a second RS-type flipflop 92 with the conditioned pulsed signals ZQ2 and ZQ4, likewise phase shifted through 180°. These two clock signal pairs are therefore shifted through 90° relative to one another.

Figure 5:
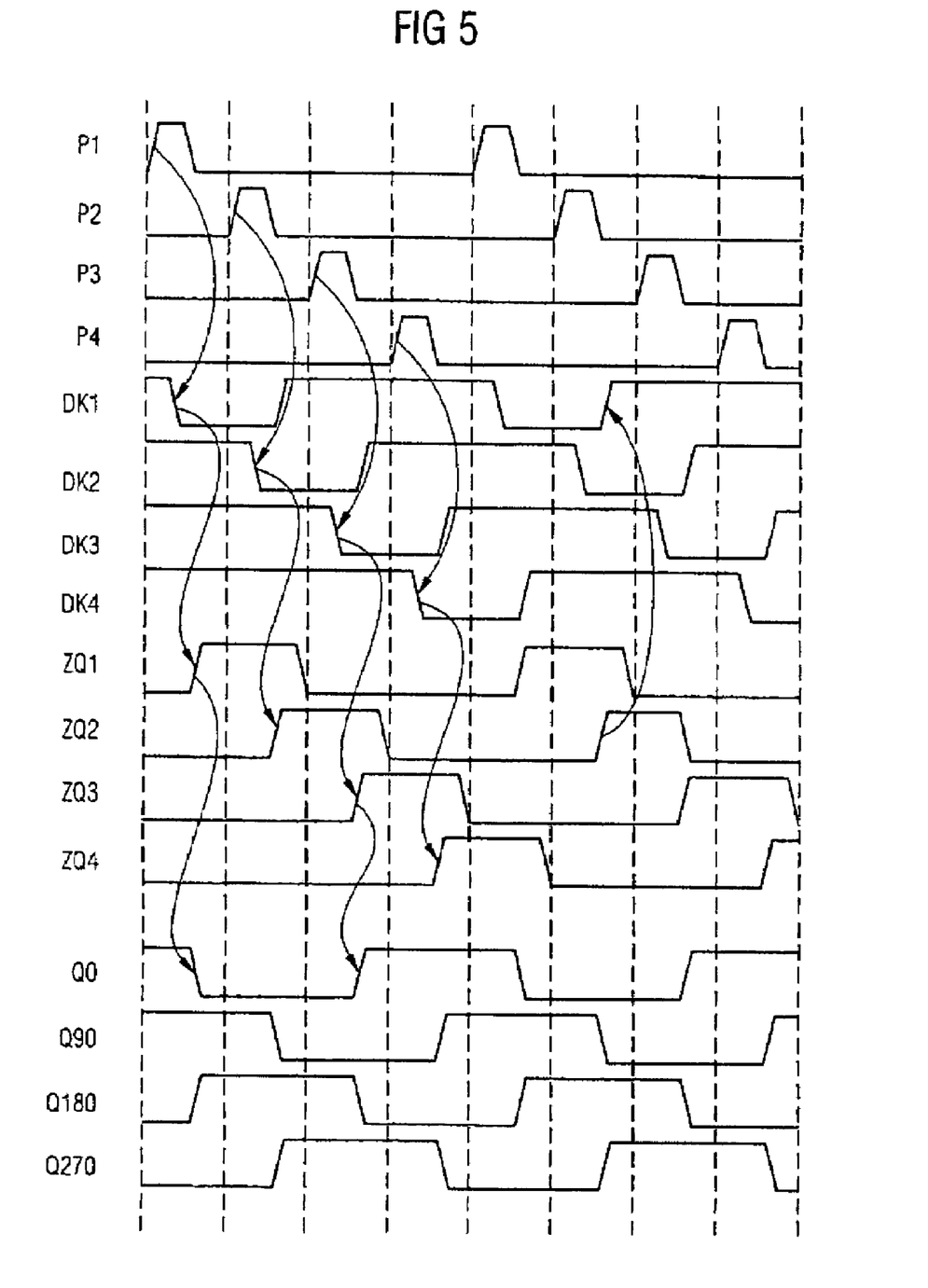
FIG. 5 are signal timing diagrams for the signals arising in the divider circuit.

The phase relationships of the buffered pulsed signals for the potentials of the conditioned pulsed signals and the output clock signals which are on the dynamic nodes 85 are explained in more detail in FIG. 5. A buffered pulsed signal P1 which is output by the inventive divider circuit, for example as shown in FIG. 2, controls a suitable discharge switch 90 (FIG. 4A), which discharges the dynamic node DK1 from its pre-charge potential and brings it to a logic L level.

The same occurs with a respective 90° shift, or a quarter of an output clock period (half an input clock period) later, as a result of the pulldown devices 84 for the dynamic nodes DK2, DK3 and DK4. The inverted potential or the inverted logic L level which is on the node DK1 corresponds to the conditioned pulse signal ZQ1. A possibly small time delay is essentially caused by the inverter 91.

The dynamic node DK1 is controlled by the conditioned pulsed signal ZQ2, and is again brought to the pre-charge potential or the first supply voltage potential VDD or logic H level. Similarly, the dynamic nodes DK2, DK3 and DK4 are respectively brought to the pre-charge potential on the basis of the respective pulsed signal following, half an input clock period of a quarter of an output clock period, or upon the respective rising edge. This produces the fixed phase relationship, particularly for the rising edges of the conditioned pulsed signals ZQ1, ZQ2, ZQ3, ZQ4.

Actuating the RS-type flipflop 92 using the conditioned pulsed signals ZQ1-ZQ4 produces the output clock signals Q0, Q90, Q180, Q270. By way of example, the data output 95 of the flipflop 92 delivers a logic L level when the signal ZQ1 applied to the Reset input 93 has a rising signal edge. The data output 95 is set to logic H level when the Set input 94 of the RS-type flipflop 92 encounters a rising signal edge, in this case in the signal ZQ3. Since the respective rising edges of the conditioned pulsed signals ZQ1, ZQ3 are phase shifted through 180°, a duty ratio of 0.5 or 50% is thus obtained for the output clock signal Q0 produced at the data output 95. Similarly, the output clock signals Q90, Q180, Q270, which are phase shifted through 90°, 180° and 270°, respectively, relative to the output clock signal Q0, are produced.

FIG. 6 shows an exemplary embodiment of the pulldown devices 97. By way of example, FIG. 6A shows that the pulldown device 97 has a dynamic storage node DK1 which can be connected to the first supply voltage potential VDD by a pre-charge transistor 86. The pre-charge transistor 86 is actuated by a signal ZQ2 which is inverted by an inverter 89. The logic level which is present on the respective dynamic storage node DK1 is inverted by an inverter 91 and is output as an output clock signal ZQ1.

Figure 6A:
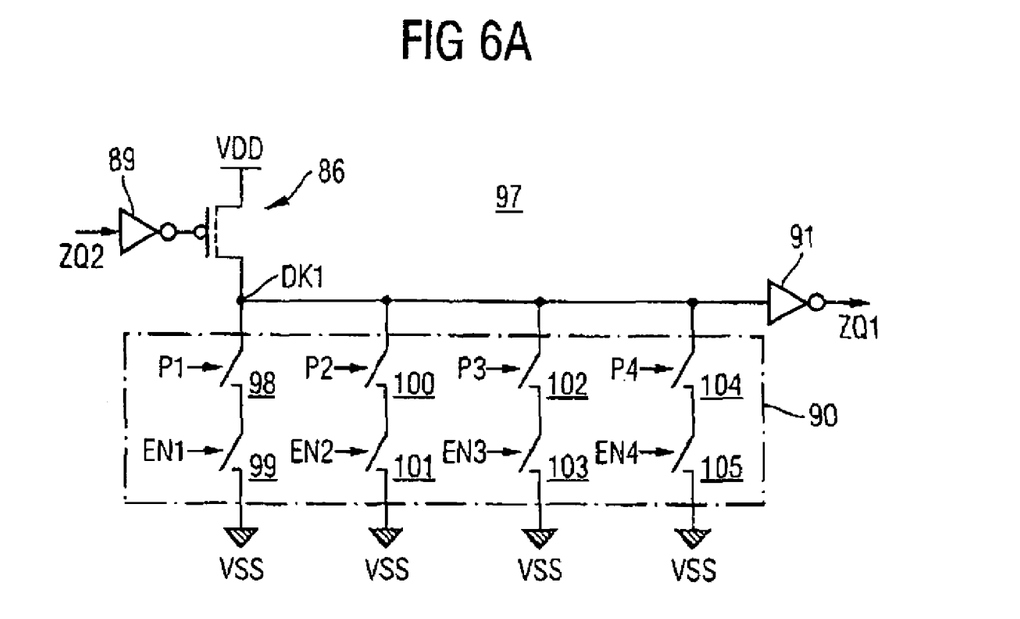
FIGS. 6A-6D are exemplary embodiments of pulldown devices for the divider circuit.
Figure 6B:
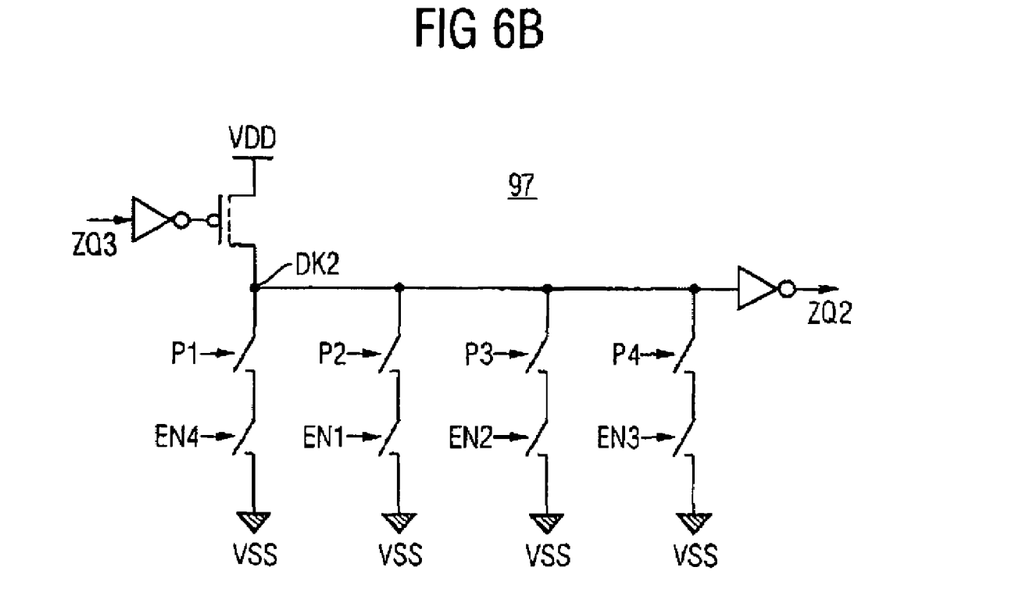
Figure 6C:
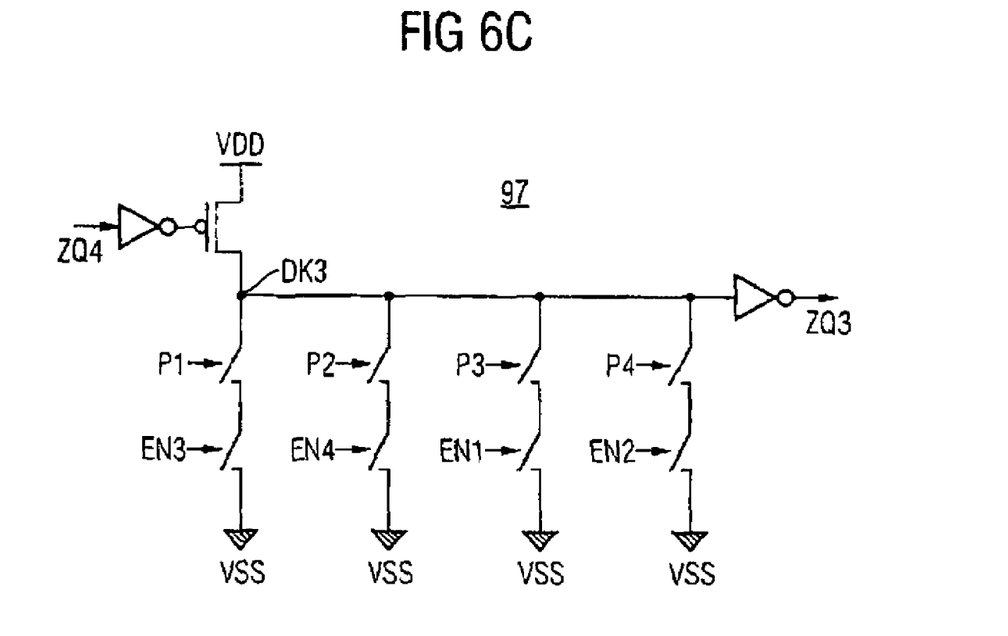
Figure 6D:
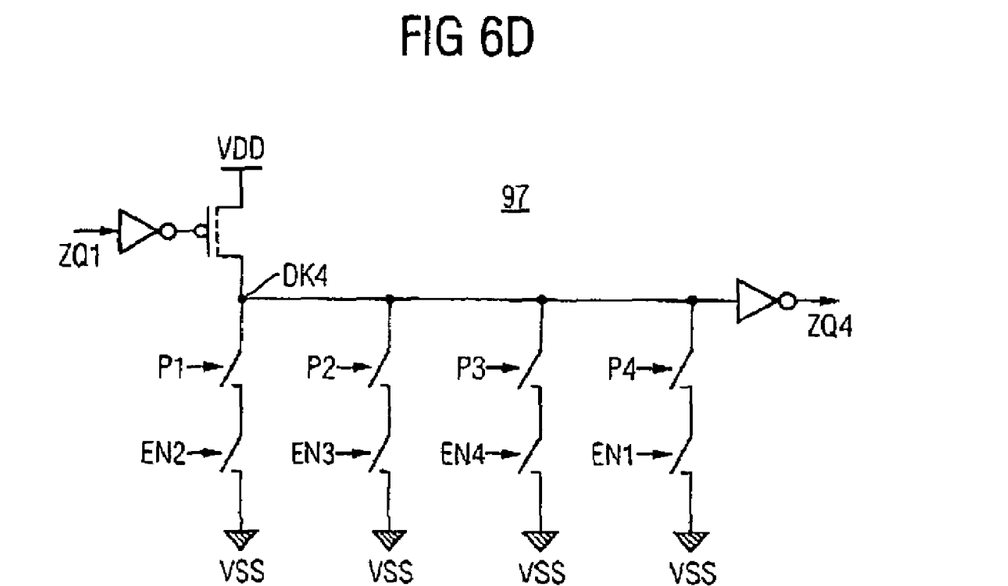

For the exemplary embodiment, a discharge device 90 is provided which comprises four discharge paths comprising two respective discharge transistors 98-105, whose controllable paths are connected up in series between the dynamic storage node DK1 and the second supply voltage potential or logic L level. A respective one of the discharge transistors 98, 100, 102, 104 is controlled by a buffered pulsed signal P1, P2, P3, P4, and the respective second discharge transistor 99, 101, 103, 105 is controlled by a further control signal EN1, EN2, EN3, EN4. The control signals EN1, EN2, EN3, EN4 can thus be used to determine the phase angle of the respective output clock signal ZQ1 or ZQ2, ZQ3, ZQ4 in arbitrary fashion.

Encoding may take place such that only one of the discharge paths, that is to say the respective two discharge transistors 98-105 connected in series, is ever connected to the second supply voltage potential VSS. Since a discharge pulse or a buffered pulsed signal P1-P4, which comprises a rising signal edge a quarter of an output clock cycle beforehand or afterwards, is available for each dynamic storage node DK1, DK2, DK3, disturbance-free switching between the various phase angles is possible.

The expanded pulldown devices shown in FIGS. 6A-6D thus allow output clock signals ZQ1, ZQ2, ZQ3, ZQ4 to be produced, with production without glitches or disturbances being possible by switching the phase angle on the basis of control signals EN1-EN4. Suitable selection of the control signals EN1-EN4 therefore allows simple formation of a phase rotator.

Although the present invention has been explained in more detail using preferred exemplary embodiments of the divider circuit, it is not limited thereto but rather may be modified in a wide variety of ways.

In particular, equivalent or similar switching topologies for the respective logic functions are naturally possible by varying the N or PMOS transistors. In principle, it is also possible to couple a pullup device to dynamic storage nodes, in which case PMOS pre-charge switches or PMOS transistors would typically be used.

The stated clock frequencies and periods of the input clock signal which is to be divided are also to be understood merely by way of example and can also be varied as desired.

What is claimed is:

1. A circuit comprising:
   at least two clock edge controlled differential buffer store elements, each being clocked by one of a pair of complementary input clock signals, each comprising internal storage nodes which are pre-chargeable to a pre-charge potential, and each comprising a differential data input; the internal storage nodes of the buffer store elements either being pre-charged at the pre-charge potential or storing a logic level, depending on the corresponding input clock signals, the differential data inputs of one of the buffer store elements being connected to the internal storage nodes of the other buffer store element, wherein the internal differential storage nodes generate pulsed signals; and
   at least one pulldown device, the pulldown device being configured to discharge a dynamic storage node pre-charged to a pre-charge potential and outputting a conditioned pulsed signal in response to at least one of the pulsed signals wherein the at least one pull down device comprises four pulldown devices, each comprising a controllable discharge switch being controlled by a respective pulsed signal; the respective pre-charge switch being controlled by a conditioned pulsed signal being phase shifted by 90° relative to a further of the conditioned pulsed signals.

2. The circuit of claim 1, wherein at least two clock edge controlled differential buffer store elements comprise at least one first and at least one second differential buffer store element, each being clocked by a respective input clock signal, each comprising a first and a second internal storage node, and each comprising a first and a second data input.

3. The circuit of claim 2, wherein in a first input clock signal phase the first and second internal storage nodes of the first buffer store element are pre-chargeable and the first and second internal storage nodes of the second buffer store element store respective logic levels applied to the first and second data inputs of the second buffer store element, and in a second input clock signal phase the first and second internal storage nodes of the second buffer store element are pre-chargeable and the first and second internal storage nodes of the first buffer store element store respective logic levels applied to the first and second data inputs of the first buffer store element.

4. The circuit of claim 2, wherein the first data input of the first buffer store element is connected to the first internal storage node of the second buffer store element, the second data input of the first buffer store element is connected to the second internal storage node of the second buffer store element, the first data input of the second buffer store element is connected to the second internal storage node of the first buffer store element, and the second data input of the second buffer store element is connected to the first internal storage node of the first buffer store element.

5. The circuit of claim 1, wherein at least one of the buffer store elements is a sense amplifier.

6. The circuit of claim 1, wherein at least one of the buffer store elements comprises at least one data output, wherein a buffer device is coupled between at least one of the internal storage nodes and the data output, and a buffered pulsed signal can be tapped off at the data output.

7. The circuit of claim 1, wherein the buffer store elements are designed utilizing CMOS transistors.

8. The circuit of claim 1, wherein an input clock signal edge prompts a logic level of the signal applied to the respective data input to be transferred to the respective internal storage node.

9. The circuit of claim 1, wherein the pulsed signals are phase shifted by a predetermined phase in respect to each another.

10. The circuit of claim 1, wherein the pulldown device comprises at least one controllable pre-charge switch which controllably and selectively connects the dynamic storage node to the pre-charge potential.

11. The circuit of claim 1, wherein the pulldown device operably connects the dynamic storage node to the pre-charge potential or to a predetermined logic level in response to at least one control signal.

12. The circuit of claim 1, wherein the conditioned pulsed signal can be tapped off at the respective dynamic storage node.

13. The circuit of claim 1, further comprising at least two RS-type flip-flops comprising a set input, a reset input, a flip-flop data output, and an inverse flip-flop data output, the set inputs and the reset inputs operably connected to receive conditioned pulsed signals.

14. A circuit comprising:
   at least two clock edge controlled differential buffer store elements, each being clocked by one of a pair of complementary input clock signals, each comprising internal storage nodes which are pre-chargeable to a pre-charge potential, and each comprising a differential data input; the internal storage nodes of the buffer store elements either being pre-charged at the pre-charge potential or storing a logic level, depending on the corresponding input clock signals, the differential data inputs of one of the buffer store elements being connected to the internal storage nodes of the other buffer store element, wherein the internal differential storage nodes generate pulsed signals; and
   at least one pulldown device, the pulldown device being configured to discharge a dynamic storage node pre-charged to a pre-charge potential and outputting a conditioned pulsed signal in response to at least one of the pulsed signals,
   wherein the conditioned pulsed signal is phase shifted by +90° relative to a first conditioned pulsed signal directly preceding the conditioned pulsed signal, phase-shifted by −90° relative to a second conditioned pulsed signal directly following the conditioned pulsed signal, and having a period duration which corresponds to twice the period of the input clock signal.

* * * * *